United States Patent [19]

Gastgeb

[11] Patent Number: 5,034,648
[45] Date of Patent: Jul. 23, 1991

[54] DUAL DIRECTION SWITCH

[75] Inventor: Raymond F. Gastgeb, Doylestown, Pa.

[73] Assignee: Atochem North America, Inc., Philadelphia, Pa.

[21] Appl. No.: 429,381

[22] Filed: Oct. 31, 1989

[51] Int. Cl.$^5$ ............................................. H01L 41/08
[52] U.S. Cl. .................................... 310/330; 310/319; 310/339; 310/800
[58] Field of Search ............................... 310/330–332, 310/338, 339, 800, 319

[56] References Cited

U.S. PATENT DOCUMENTS

| | | | |
|---|---|---|---|
| 3,701,903 | 10/1972 | Merhar | 310/319 X |
| 3,970,862 | 7/1986 | Edelman et al. | 307/88 ET |
| 4,409,548 | 10/1983 | Focht | 310/339 X |
| 4,488,873 | 12/1984 | Bloomfield et al. | 433/71 |
| 4,490,639 | 12/1984 | Echols et al. | 310/800 X |
| 4,585,970 | 4/1986 | Koal et al. | 310/331 |
| 4,868,566 | 9/1989 | Strobel et al. | 310/339 X |
| 4,896,069 | 1/1990 | Rosenberg et al. | 310/339 |
| 4,904,222 | 2/1990 | Gastgeb et al. | 310/800 X |

OTHER PUBLICATIONS

Ben H. Carlisle, "Piezoelectric Plastics Promise New Sensors", *Machine Design* (Oct. 23, 1986), pp. 105–110.
Kynar® Piezo Film Technical Manual (1987), Pennwalt Corporation, Philadelphia, PA.
"Kynar® Piezo Film Product Summary and Price List" (1988), Pennwalt Corporation, Philadelphia, PA.
Gale E. Nevil et al., "The Potential of Corrugated PVDF Bimorphs for Actuation and Sensing", Paper from *Robotics Research: The Next Five Years and Beyond* (Aug. 14–16, 1984).
James E. Hubbard et al., "The Active Vibration Control of a Cantilever Beam Using PVF$_2$ in a Simulated Space Environment", CSDL-R-1821 Draper Laboratory Report (Dec. 1985).

Primary Examiner—Mark O. Budd
Attorney, Agent, or Firm—Woodcock Washburn Kurtz Mackiewicz & Norris

[57] ABSTRACT

A piezo film switch comprises a cantilever with a pair of layers, including a piezo film layer and a flexible, backing layer laminated thereto. The piezo film layer produces a positive or negative output pulse, depending upon a direction of deflection of the cantilever. Interface circuitry coupled to the piezo film layer is powered by the output pulses and provides "pseudo contact closures" which emulate the operation of a mechanical switch.

21 Claims, 2 Drawing Sheets

DUAL DIRECTION SWITCH

BACKGROUND OF THE INVENTION

1. Field of the Invention

The present invention relates generally to a piezo film switch, and more particularly to a piezo film switch capable of providing an indication of movement in two opposite directions.

2. Statement of the Prior Art

Piezo film is a flexible, lightweight, tough plastic film which is typically formed of a polarized homopolymer of vinylidene fluoride (e.g., polyvinylidene fluoride or "PVDF"). Piezo film is adaptable to diverse applications because of its piezoelectric nature. KYNAR® piezo film, available from the assignee of the instant application, is one example of a piezo film.

It is well known that when a working voltage is applied to the electrodes of piezo film, it will elongate or contract, depending on the polarity of the applied voltage. If the film is exposed to an alternating voltage, it will elongate and contract as the polarity changes. It is also well known that when an external force is applied to the film (e.g., compressive or tensile strain), the film develops a proportionate open circuit voltage. Exposure to a reciprocating force results in a corresponding alternating electrical voltage signal.

One application for piezo films is in switches. See, for example, Ben H. Carlisle, "Piezoelectric Plastics Promise New Sensors", *Machine Design* (Oct. 23, 1986), pp. 105-110. For most applications, a piezo film switch can be made by laminating a piezo film to one surface of a thin, flat spring. When a stress is applied to the film, such as by deflecting the spring, a voltage pulse is provided. The amplitude of the voltage pulse in the piezo film switch is directly proportional to the magnitude of applied stress, and hence to the resulting strain. Moreover, deforming the film by stretching its length will maximize the stress, and therefore the resulting output voltage, since the applied stress acts upon the film's cross-section.

Piezo film switches have distinct advantages over other types of switches. They are not susceptible to malfunction by contaminants such as dirt, moisture and abrasive dust which tend to cause failure in conventional mechanical switches. Since a piezo film switch operates essentially by developing a charge within the film and transferring that charge to the film's outer electrodes, no mechanical closure or opening is required to make or break an electrical contact. Unlike membrane keyboard switches that radiate high frequencies during an electronic scan, piezo film switches operate at low current and generate minimal RF levels. Furthermore, piezo film switches do not experience "contact bounce" and therefore they simplify circuit design.

Additional information relating to the structure, properties, applications and fabrication of piezo film switches, as well as piezo films in general, can be found in the Kynar® *Piezo Film Technical Manual* (1987), which is available from Pennwalt Corporation, Philadelphia, Pennsylvania, the assignee of the present application. This manual is incorporated herein by reference.

Most prior art piezo film switches provide better performance when subjected to tensile, rather than compressive, strain. Therefore, these switches have not been utilized in designs requiring sensing of deflection in two directions (compression and tension) with satisfactory results. Applications where such a dual direction switch may be employed include turnstiles, gates, utility meters, pinball machines, etc., i.e., wherever sensing of mechanical motion in two opposite directions is required. The present invention addresses the need for a piezo film switch that can be employed in these applications.

SUMMARY OF THE INVENTION

According to the invention, a dual direction piezo film switch comprises a cantilever with a pair of layers including a piezo film layer and a flexible, backing layer laminated thereto, and, self powered interface circuitry coupled to the piezo film layer for providing a "pseudo contact closure" in response to deflection of the cantilever in either direction. A positive pulse is output by the piezo film layer when the tip (i.e., distal end) of the cantilever is deflected in one direction. Similarly, a negative pulse is output by the piezo film layer when the tip is deflected in the other direction. These pulses power the interface circuitry, and the circuitry is active only when a pulse occurs.

The interface circuitry comprises a pair of MOSFET's coupled to receive the pulses. Upon occurrence of a pulse, one of the MOSFET's "turns on" (i.e., becomes conductive) and provides a substantial closed circuit path (i.e., low resistance electrical path) defining the pseudo contact closure. Both MOSFET's remain "off" (nonconductive) to provide a substantial open circuit path (i.e., high resistance electrical path) in the absence of any output pulses.

The cantilever is preferably clamped by clamping means located adjacent its proximal end. A sensor housing preferably houses the clamping means and interface circuitry. This arrangement provides a stress relief for a cable connecting the interface circuitry to output electronics such as a driver circuit and/or counter circuit.

In one exemplary application, the switch of the instant invention may be employed to provide an indication of the net speed and/or direction of rotation of a mechanical device such as a gear, spindled shaft, turnstiles, etc. For example the cantilever tip may be juxtaposed to the gear, shaft, etc. so that the tip is deflected whenever a tooth of the gear, shaft, etc. rotates past the tip, irrespective of the direction of rotation. A counter may be employed to maintain a count of the net number of revolutions of the gear, shaft, etc. In another exemplary application, the switch of the instant invention may be employed to provide an indication of the direction of impact of a pinball on a bumper in a pinball machine.

Other advantages and novel features will become more apparent from the following detailed description of the invention, in conjunction with the accompanying drawings wherein:

DETAILED DESCRIPTION OF THE INVENTION

Figure 1:
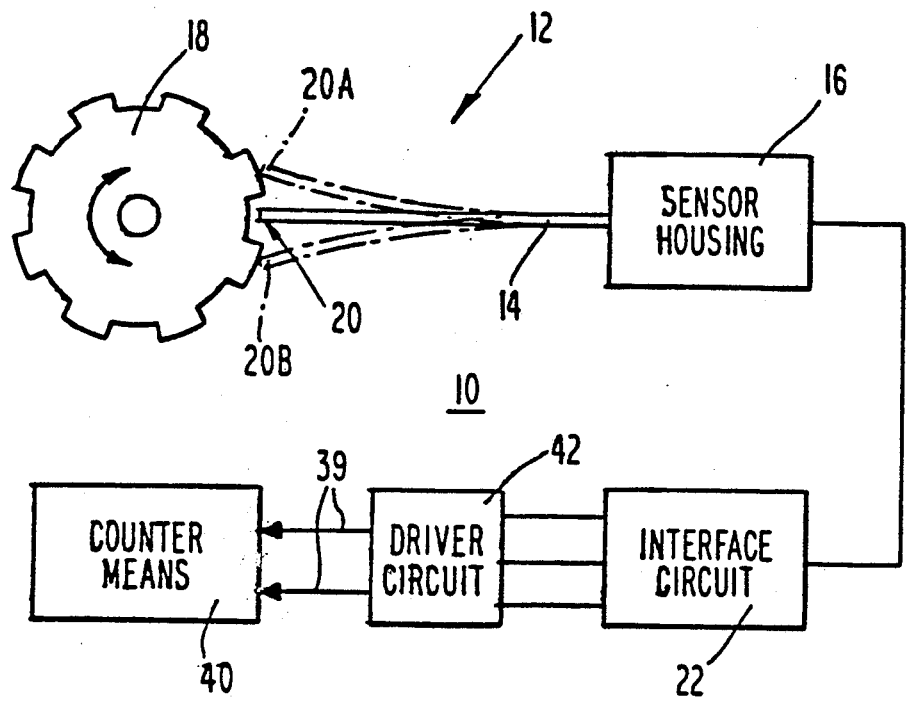
FIG. 1 is a simplified block diagram of an exemplary application employing a piezo film switch in accordance with the o present invention.

Referring now to the drawings, wherein like characters designate like or corresponding parts throughout the several views, there is shown in FIG. 1 a metering apparatus 10 representing one exemplary application of a piezo film switch 12 provided in accordance with the present invention. It should be understood that though the invention is described herein for use in a metering apparatus, this description is for exemplary purposes only. The invention is not limited to this exemplary application except as expressly set forth in the appended claims.

The piezo film switch 12 generally comprises a cantilever 14 coupled adjacent its proximal end to a sensor housing 16. The distal end or tip 20 is free to deflect in opposite directions as shown in phantom at 20A and 20B. There is also provided interface circuit mean 22 coupled to the cantilever 14 for providing one "pseudo contact closure" when the tip 20 is deflected in a first direction, and another "pseudo contact closure" when the tip 20 is deflected in a second opposite direction. A driver circuit 42 may also be provided for reasons that will become evident hereinafter.

In the exemplary metering apparatus of FIG. 1, a mechanical device 18 may be employed for deflecting the tip 20 of the cantilever 14. The device 18 may be a gear, splined shaft, or any other suitable mechanical device. It should again be understood that use of a mechanical device 18 to deflect the cantilever 14 represents only one application of the invention, and except as expressly set forth in the appended claims, the invention is not limited thereto. The mechanical device 18 may be movable by the metering apparatus, or by a turnstile, gate, or any other apparatus that will move the device 18 in two opposite directions.

Figure 2:
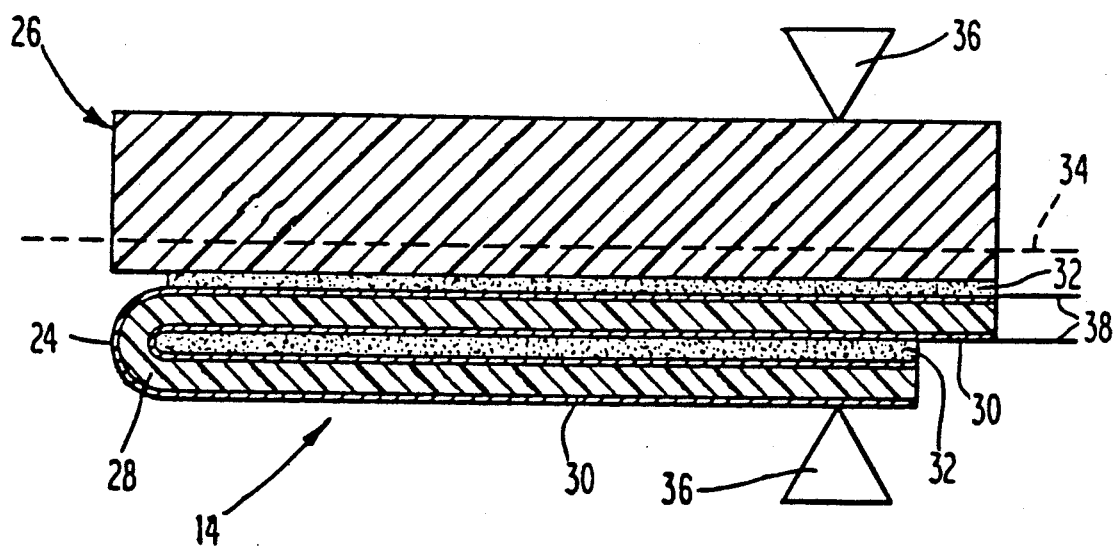
FIG. 2 depicts a detailed sectional view of the piezo film switch shown in FIG. 1.

Referring to FIG. 2, the cantilever 14 is seen generally as having a pair of layers that includes a piezo film layer 24 and a flexible, backing layer 26 which is laminated to the piezo film layer 24. Preferably, the piezo film layer 24 comprises any polymeric material that exhibits a piezoelectric effect, such as polyvinylidene fluoride (PVDF); a copolymer of vinylidene fluoride (VDF), such as a copolymer of VDF including at least one of trifluoroethylene (TrFE), tetrafluoroethylene, hexafluoroethylene or vinylidene chloride; a polymer of polyvinyl chloride; or, a ploymer of acrylonitrile. One suitable such polyvinylidene fluoride film is manufactured under the registered trademark Kynar® by the assignee of the present invention, Pennwalt Corporation of Philadelphia, PA, although other polymeric piezo films can be utilized without departure from the true scope of this invention. More detailed information relating to particular piezo film products of this type is found in the "Kynar® Piezo Film Product Summary and Price List" (1988) available from Pennwalt Corporation. The other above mentioned films that can be employed in the practice of this invention are also commercially available.

According to one embodiment, the piezo film layer 24 includes a single layer 28 of piezo film (preferably a 28 μm-thick layer of a Kynar® piezo film) that is folded back on itself in U-shaped fashion. A metallic electrode 30 is applied to the inner and outer faces of the folded U-shaped film as shown in FIG. 2 and forms a shield for the piezo film. Any conventional process may be used for applying the metallic electrode 30, but two presently preferred processes are: (1) deposition of thin metal layers by vacuum metallization; or (2) deposition of thicker coatings by spraying, or by silk-screening with conductive silver ink. The metallic electrodes 30 may comprise a metal selected from the group consisting of copper, silver, nickel, aluminum, tin, gold and chromium, as well as combinations thereof (e.g., NiAgNi).

Once the piezo film layer 24 is formed with its layer of piezo film 28 and metallic electrode 30 and folded back on itself, it is maintained in the U-shape by adhesive 32 disposed between the inner faces of the two layers. Acrylic, epoxy, urethane and cyano acrylate polymer based adhesive are all suitable for use as adhesive layer 32. For example, a very thin, high strength, rigid adhesive layer 32 is obtainable with epoxies (e.g., G.C. Electronics Epox #347 with Hardener #10-347 or Loctite Corporation's Duro E-POX-E 5 Resin). One suitable urethane-based adhesive is Tycel®, which is manufactured by Lord Corporation as a general purpose adhesive for bonding piezo film to most surfaces. Ultra-thin bonding layers can also be achieved by applying a resin to one surface, and its hardener to the other. An extremely thin layer of Loctite #495 cyano acrylate is also suitable with silver ink metallization.

The folded over piezo film layer is preferably adhered to backing 26, also by means of adhesive 32. The backing layer 26 preferably comprises 5 mil thick MYLAR®.

The piezo film layer 24 shown in FIG. 2 is a single layer of piezo film 28. In a second embodiment, the piezo film layer 24 may comprise a "bimorph" or a "multimorph" laminate. Bimorph (i.e., two-layer) or multimorph (i.e., more than two layers) laminates are well known and are easily fabricated. As is known, an applied voltage causes one film to elongate and the other film to contract and results in "bender" motion.

In either embodiment, when the cantilever 14 is deflected, e.g., by mechanical means 18 or otherwise, an output voltage pulse results. The magnitude of the pulse is directly proportional to the amount of deflection of the tip 20, as well as to the square of the thickness of the piezo film layer 24. The pulse magnitude is inversely proportional to the square of the length of the piezo film layer 24.

The piezo film cantilever 14 thus described is preferably clamped adjacent its proximal end to a sensor housing 16 by any suitable clamping means 36. This forms a neutral bending axis 34 that is disposed somewhere in the layer 26 when the cantilever is at rest. That is, one end of the sensor housing 16 preferably either comprises or houses the clamping means 36 and deflections of the tip 20 are measured from the neutral bending axis 34. The stretch direction of the film layer 28 should be oriented parallel to the bending axis 34 of the cantilever to generate the greatest output voltages in both directions of deflection. An output voltage will not be generated by the piezo film layer 24 if tip 20 is undeflected with respect to the neutral bending axis 34.

A pair of leads 38 is provided for coupling the metallic electrodes 30 to interface circuitry 22. As can be seen more clearly from FIGS. 3 and 4, circuitry 22 is provided as an interface between the piezo film layer 24 (FIGS. 1 and 2) and external circuitry, e.g., driver circuitry 42 and counter circuitry 40. The interface circuitry 22 provides "pseudo-contact closures", i.e., it converts positive and negative pulses from the piezo film layer 24 into high and low resistance outputs that resemble the open and closed states of a mechanical switch. An important feature of the present invention is that the interface electronics 22 is completely self-powered by the piezo film layer 24, i.e., no external power is required, and the circuitry 22 is active only when an output pulse from the piezo layer occurs.

Figure 3:
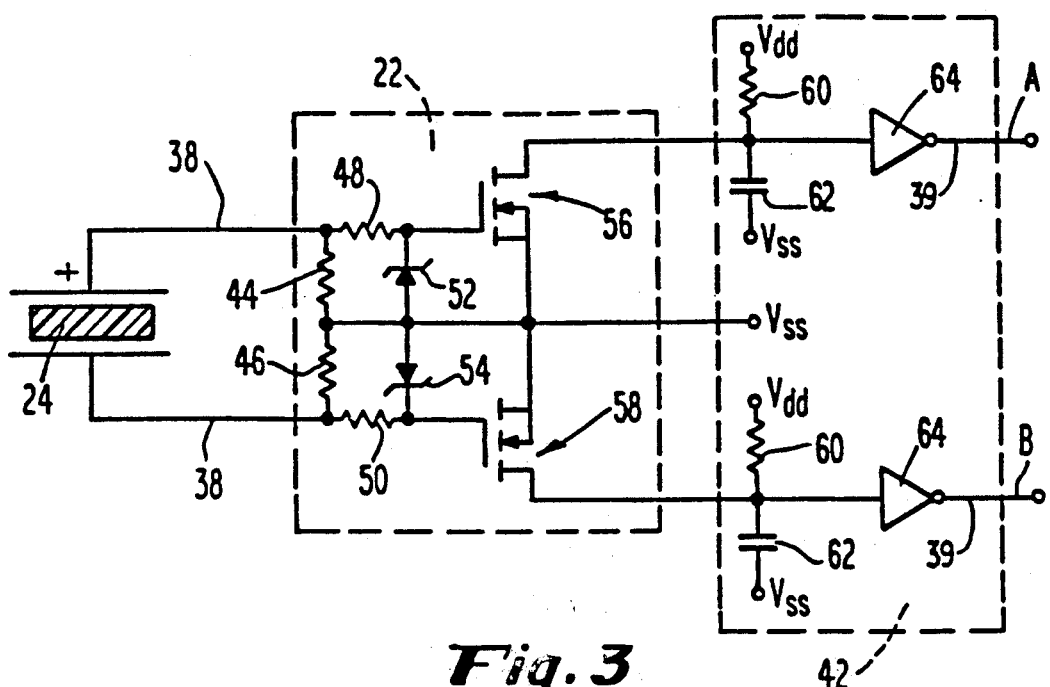
FIG. 3 schematically illustrates a preferred embodiment of the interface and driver interface circuitry shown in FIG. 1; and, FIG. 4 is a timing diagram illustrating outputs from the piezo film layer and driver circuitry.
Figure 4:
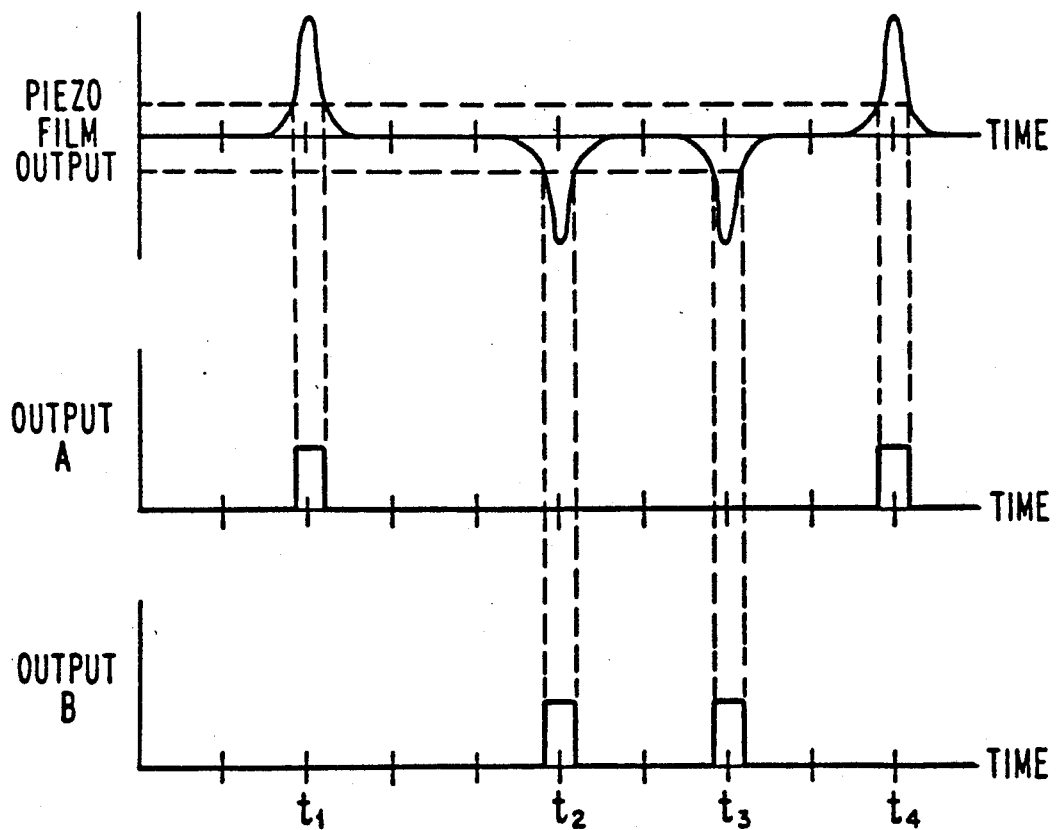

The interface circuit 22, in accordance with a presently preferred embodiment of this invention, generally comprises a pair of gate resistors 44, 46, a pair of series resistors 48, 50, a pair of zener diodes 52, 54, and a pair of transistors 56, 58, which are connected together as shown in FIG. 3. For use in the interface circuit 22 described herein, enhancement-type (i.e., "normally off") MOSFET's are preferred due to their characteristic gate turn-on voltages. The turn-on voltage of the MOSFET selected for use herein is typically 2.5 volts, which is about one-fourth of the expected output voltage of the piezo film 24. When this voltage is applied to the gates of the MOSFET's 56, 58, the drain-source "on" resistance will be very low, i.e., the transistor will "turn on" and become highly conductive. The series resistors 48, 50 and zener diodes 52, 54 are provided to protect the gates of the MOSFET'S 56, 58. The series resistors 48, 50 limit the current through the zener diodes 52, 54 when their threshold voltage is exceeded. In certain cases resistors 48, 50 may be omitted with no change to the circuit's performance. In the preferred practice of the invention, the resistors 44, 46 are 10 Mohm each, the resistors 48, 50 are 1 Kohm each, the diodes 52, 54 are 9 V zener diodes, and the MOSFET's 56, 58 are each a BS170. The gate resistors 44, 46 provide a path for leakage current from the gates of the MOSFET's 56, 58. This current will typically e on the order of picoamperes.

When the tip 20 of cantilever 14 is deflected in the direction shown in phantom at 20A (FIG. 1), the piezo film 24 expands and generates a positive charge. This positive charge creates a voltage of positive polarity as is depicted by the positive-going piezo film output at time $t_1$ in FIG. 4. As piezo film output voltage increases in a positive direction, the voltage drop across each of the gate resistors 44, 46 (forming a voltage divider) will be substantially equal to one-half of the piezo film output voltage. The voltage drop across gate resistor 46 will continue to increase until the voltage across zener diode 54 reaches its forward threshold voltage, typically about 0.7 volt. The voltage drop across resistor 46 will also be about 0.7 volt. The zener diode 54 limits any further voltage increases across resistor 46.

As the piezo film output voltage continues to increase, the remainder of the voltage will develop across resistor 44. When the voltage across resistor 44 reaches about 2.5 volts, MOSFET 56 will begin to conduct. This represents a "pseudo contact closure" since there is now substantial low resistance conduction through MOSFET 56. As the piezo film output voltage continues to increase with further deflection of tip 20, the voltage across resistor 44 will increase until the breakdown (i.e., zener) voltage of zener diode 52 is reached. When this occurs, the zener diode 52 will begin to conduct and limit any further voltage increases in the interface circuitry 22 and the piezo film 24, even if the tip 20 is deflected any further in the same direction.

Due to the symmetry of the interface circuitry 22, when the tip 20 of cantilever 14 is deflected in the opposite direction shown in phantom at 20B (FIG. 1), the piezo film 24 will compress and generate a negative charge. This negative charge creates a voltage of negative polarity as is depicted by the negative-going piezo film output at time $t_2$ in FIG. 4. As piezo film output voltage increases in a negative direction, the voltage drop across each of the gate resistors 44, 46 will again be substantially equal to one-half of the piezo film output voltage. The voltage drop across gate resistor 44 will continue until the voltage across zener diode 52 reaches its forward threshold voltage, again about 0.7 volt. As piezo film output voltage continues to decrease (go negative), the remainder of the voltage will develop across resistor 46. When the voltage across resistor 46 reaches about 2.5 volts, MOSFET 58 will begin to conduct and provide another "pseudo contact closure." As the piezo film output voltage continues to increase with further deflection of tip 20, the voltage across resistor 46 will increase until the breakdown (zener) voltage of zener diode 54 is reached. When this occurs, the zener diode 54 will begin to conduct and limit any further voltage increases in the interface circuitry 22 and the piezo film 24, even if the tip 20 is deflected any further in same direction. It will therefore be appreciated that the outputs of the interface circuitry 22 emulate the opening and closing of mechanical switches and therefore define "pseudo contact closures."

Each drain of each MOSFET 56, 58 constitutes an output of the interface circuitry 22. In one exemplary application of the invention, the drain terminals are connected as inputs to inverter/driver circuitry 42. The inverter/driver circuitry 42 is responsive to the pseudo contact closures provided by interface circuitry 22 and provides digital logic signals that can be transmitted over several hundred feet of cable. The digital logic signals correspond to the pseudo contact closures, e.g., a digital "1" corresponds to a closure (MOSFET "on" or conducting) and a digital "0" corresponds to an opening (MOSFET "off" or nonconducting).

The inverter/driver circuitry comprises pull up resistors 60 coupled to a source of supply voltage $V_{dd}$, a pair of capacitors 62 coupled to ground $V_{ss}$, and a pair of inverters 64, all connected together as shown. Resistors 60 are preferably 47 Kohm each; capacitors 62 are preferably 27 pF each; and the inverters 64 are preferably a 74HC14. As can be seen, the drain terminals of MOSFET's 56, 58 are coupled to the pull up resistors 60. In this manner, no external power is required to be provided directly to the interface circuitry 22 when the inverter/driver circuit 42 is provided. Furthermore, no protection circuitry is necessary on the outputs of interface circuitry 22, since the drain-source of each MOSFET 56, 58 acts much like a zener diode. That is, interface circuit 22 will conduct at the predetermined level (i.e., 0.7 volt) when forward biased, and at the drain-source breakdown voltage when reversed biased.

The outputs of the inverter/driver circuitry 42 enable monitoring of the piezo film output as the piezo film switch 12 (FIG. 1) is deflected. Accordingly, whether a positive-going piezo film output occurs (e.g., times $t_1$ and $t_4$ in FIG. 4) or a negative-going piezo film output (e.g., times $t_2$ and $t_3$ in FIG. 4), the inverter gates 64 will produce a corresponding digital output A or B, depending upon the particular direction in which the tip 20 is deflected. A pulse on the A output of the inverter/driver circuit 42 is indicative of a positive going deflection, while a pulse on the B output is indicative of a negative going deflection.

In the exemplary application of the invention illustrated in FIG. 1, a counter means 40 may be provided for maintaining a count of the net number of positive and negative going deflections. The counter 40 receives the outputs from the inverter/driver circuitry over lines 39. It will be appreciated that this count will also be indicative of the net number of revolutions of the mechanical device 18. A binary up-down counter may be employed for the counter means 40, incrementing when a "positive" pulse appears on the "A" output of the inverter/driver circuit 42 (i.e., when the tip 20 is deflected in the direction shown at 20A), and decrementing when a "negative" pulse appears on the "B" output (i.e., when the tip 20 is deflected in the direction shown at 20B). In this manner, the piezo film switch 12 of the present invention may employed in metering apparatus which remotely converts incremental rotation (e.g., the rotation of a wheel in a utility meter) to electrical signals for monitoring at an external location.

Obviously, many modifications and variations are possible in light of the above teachings. For example, through installation of the interface circuit 22 within the sensor housing 16, a compact device is provided that can also provide strain relief to any cable 39 that couples the leads 38 to external monitoring means such as the counter means. Moreover, while only one counter has been disclosed for counting the "positive" and "negative" pulses from the inverter/driver circuit 42, it should be understood that more than one counter can be used such as where one counter counts positive signals only, and the other counter counts negative signals. It should be understood therefore that within the scope of the appended claims, the present invention may be practiced otherwise than as is specifically described herein.

What I claim as my invention is:

1. A piezoelectric switch comprising:
   a cantilever comprising a piezoelectric film layer, a distal end of the cantilever defining a tip, the piezo film layer producing an output pulse in response to deflection of the tip in either one of two directions; and,
   an interface circuit having first and second outputs, the interface circuit being coupled to the piezo film layer and powered by the output pulses produced by the piezo film layer for providing a substantially closed circuit path on only the first output in response to deflection of the tip in a first direction and on only the second output in response to deflection of the tip in a second opposite direction and a substantial open circuit path on both outputs in the absence of an output pulse.

2. Switch according to claim 1 wherein the interface circuit comprises at least one MOSFET having a gate terminal operatively coupled to receive the output pulse from the piezo film layer, the MOSFET becoming conductive and providing the substantially closed circuit path on one of the first and second outputs between source and drain terminals of the MOSFET in response to the occurrence of an output pulse.

3. Switch according to claim 1 wherein the piezo film layer produces an output pulse of a first polarity when the tip is deflected in the first direction and produces an output pulse of a second polarity when the tip is deflected in the second opposite direction, the interface circuit having means for providing the substantially closed circuit path on the first output in response to an output pulse of the first polarity and on the second output in response to an output pulse of the second polarity.

4. Switch according to claim 3 wherein the interface circuit comprises:

first and second MOSFET's each having gate, source and drain terminals, the source terminals being operatively coupled to each other to define a common terminal;

first and second zener diodes coupled across the gate and source terminals of each MOSFET, a cathode of each zener diode being coupled to the gate of each MOSFET and an anode of each zener diode being coupled to the common terminal;

first and second resistors coupled in series to form a voltage divider across an output of the piezo film layer, a common junction of the resistors being coupled to the common terminal; and third and fourth resistors each coupling the cathodes of the zener diodes to opposite the end of the voltage divider;

the source and drain of the first MOSFET providing the substantially closed circuit path on the first output when the magnitude of an output pulse of the first polarity exceeds a threshold voltage of the second zener diode, the source and drain of the second MOSFET providing the substantially closed circuit path on the second output when the magnitude of an output pulse of the second polarity exceeds a threshold voltage of the first zener diode.

5. Switch according to claim 1 wherein the cantilever further comprises a flexible film backing layer laminated to the piezo film layer.

6. Switch according to claim 5 further comprising clamping means disposed adjacent a proximal end of the cantilever for clamping the cantilever and permitting deflection of the tip.

7. Switch according to claim 6 wherein a neutral bending axis is defined by the combination of the cantilever and clamping means and is disposed within the flexible backing member.

8. Switch according to claim 5 wherein the piezo film layer is generally U-shaped and comprises a metallic layer disposed on each of inner and outer surfaces thereof, and the interface circuit is coupled to the metallic layers.

9. System comprising:
   a metal clad, generally U-shaped flexible piezo film layer clamped at one end to define a cantilever, the piezo film layer producing an output pulse in response to deflection of the cantilever in either one of two directions;
   an interface circuit having first and second outputs, the interface circuit being coupled to the metal cladding to receive the output pulses and being powered by the output pulses, the interface circuit providing a substantially low resistance electrical path on only the first output in response to deflection of the tip in a first direction and on only the second output in response to deflection of the tip in a second opposite direction and a substantially high resistance electrical path on both outputs in the absence of an output pulse; and,
   a driver circuit coupled to the outputs of the interface circuit for converting the low and high resistance electrical paths into voltage signals for transmission over a cable.

10. System according to claim 9 further comprising a counter circuit coupled to the outputs of the driver circuit for maintaining a net count of the number of deflections of the cantilever.

11. System according to claim 10 further comprising mechanical means juxtaposed a tip of the cantilever for deflecting the cantilever.

12. System according to claim 9 wherein the piezo film layer produces an output pulse of a first polarity when the cantilever is deflected in the first direction and produces an output pulse of a second polarity when the cantilever is deflected in the second opposite direction, the interface circuit having means for providing the substantially low resistance electrical path on the first output in response to an output pulse of the first polarity and on the second output in response to an output pulse of the second polarity.

13. System according to claim 12 wherein the interface circuit comprises first and second transistors, the first transistor coupled to conduct and provide the substantially low resistance electrical path on the first output and the second transistor coupled to be nonconductive and provide the substantially high resistance electrical path on the second output in response to an output pulse of the first polarity, the second transistor coupled to conduct and provide the substantially low resistance electrical path on the first output and the first transistor coupled to be nonconductive and provide the substantially high resistance electrical path on the second output in response to an output pulse of the second polarity, the transistors each having a pair of terminals for providing the low and high resistance electrical paths.

14. System according to claim 13 wherein the driver circuit comprises a first driver element coupled to a terminal of the first transistor for providing a first signal having a level corresponding to the conduction/nonconduction status of the first transistor, and a second driver element coupled to a terminal of the second transistor for providing a second signal having a level corresponding to the conduction/nonconduction status of the second transistor.

15. System according to claim 14 further comprising an up/down counter coupled to receive the first and second signals provided by the driver circuit, the counter incrementing upon each occurrence of a predetermined level of the first signal and decrementing upon each occurrence of a predetermined level of the second signal.

16. Metering apparatus comprising:
mechanical means movable in opposing directions by the metering apparatus;
a cantilever having a tip juxtaposed to the mechanical means for deflection thereby in one of the opposing directions, the cantilever comprising a pair of layers including a piezo film layer and a flexible, backing layer laminated to the piezo film layer and a flexible, backing layer laminated to the piezo film layer, the piezo film layer providing an output pulse in response to deflection of the tip in either directions;
circuit means having first and second outputs, the circuit means being coupled to the piezo film layer for providing a first signal on only the first output when the mechanical means deflects the tip in one direction and for providing a second signal on only the second output when the mechanical means deflects the tip in the opposite direction.

17. Metering apparatus according to claim 16 wherein said circuit means comprises:
interface circuit means coupled to the piezo film layer for providing a pseudo-contact closure; and,
driver circuit means coupled to the interface circuit means for providing the first and second signals.

18. Metering apparatus according to claim 17 wherein the interface circuit means comprises:
a pair of transistors each having a source, a drain and a gate, the source of the transistors coupled together;
a pair of gate resistors, each gate resistor coupled to provide a leakage path for current from the gate of a respective one of the pair of transistors; and
means for protecting the gate of each transistor.

19. Metering apparatus according to claim 18 wherein each transistor comprises an enhancement-type MOSFET.

20. Metering apparatus according to claim 18 wherein the gate protecting means comprises:
a pair of series resistors, each series resistor coupled in series with the gate of a respective one of said pair of transistors; and
a pair of zener diodes, each the zener diode coupled in parallel with a respective one of the pair of series resistors.

21. Metering apparatus according to claim 17 wherein the driver circuit means comprises a pair of digital inverter gates, each gate coupled to a respective one of the pair of transistors.

* * * * *